United States Patent
Tao et al.

(10) Patent No.: US 11,437,525 B2
(45) Date of Patent: Sep. 6, 2022

(54) SILICON CARBIDE POWER DIODE DEVICE AND FABRICATION METHOD THEREOF

(71) Applicant: HUNAN SANAN SEMICONDUCTOR CO., LTD., Hunan (CN)

(72) Inventors: Yonghong Tao, Xiamen (CN); Zhidong Lin, Xiamen (CN); Zhigao Peng, Xiamen (CN)

(73) Assignee: HUNAN SANAN SEMICONDUCTOR CO., LTD., Hunan (CN)

( * ) Notice: Subject to any disclaimer, the term of this patent is extended or adjusted under 35 U.S.C. 154(b) by 0 days.

(21) Appl. No.: 16/928,373

(22) Filed: Jul. 14, 2020

(65) Prior Publication Data
US 2022/0005959 A1    Jan. 6, 2022

(30) Foreign Application Priority Data

Jul. 1, 2020   (CN) .......................... 202010626793.3
Jul. 1, 2020   (CN) .......................... 202010626798.6
Jul. 1, 2020   (CN) .......................... 202021269885.2

(51) Int. Cl.
*H01L 29/872* (2006.01)
*H01L 29/45* (2006.01)
(Continued)

(52) U.S. Cl.
CPC ........ *H01L 29/872* (2013.01); *H01L 29/1608* (2013.01); *H01L 29/456* (2013.01); *H01L 29/66143* (2013.01)

(58) Field of Classification Search
CPC ..... H01L 29/16; H01L 29/16; H01L 29/1608; H01L 29/45; H01L 29/456; H01L 29/66;
(Continued)

(56) References Cited

U.S. PATENT DOCUMENTS 6,861,723 B2   3/2005  Willmeroth
7,851,881 B1 * 12/2010 Zhao .................. H01L 21/0495
                                                            257/471
(Continued)

FOREIGN PATENT DOCUMENTS

CN    102084487 A    6/2011
CN    103633150 A    3/2014
(Continued)

OTHER PUBLICATIONS

PCT International Search Report & Written Opinion for PCT/CN2021/103440; dated Sep. 21, 2021.
(Continued)

*Primary Examiner* — Monica D Harrison
(74) *Attorney, Agent, or Firm* — Stetina Brunda Garred & Brucker

(57) ABSTRACT

A silicon carbide power diode device has a silicon carbide substrate on which a silicon carbide epitaxial layer with an active region is provided. A Schottky metal layer is on the active region, and a first electrode layer is on the Schottky metal layer. A first ohmic contact is on the silicon carbide substrate, and a second electrode layer is on the first ohmic contact. The active region of the silicon carbide epitaxial layer has a plurality of first P-type regions, a plurality of second P-type regions, and N-type regions. The first P-type regions and the second P-type regions lacking an ohmic contact are spaced apart with dimensions of the second P-type regions being minimized and the N-type regions being maximized for given dimensions of the first P-type region. Second ohmic contacts are located between the first P-type region and the Schottky metal layer.

18 Claims, 5 Drawing Sheets

(51) Int. Cl.
*H01L 29/66* (2006.01)
*H01L 29/16* (2006.01)

(58) Field of Classification Search
CPC ............ H01L 29/661; H01L 29/6614; H01L 29/66143; H01L 29/87; H01L 29/872
USPC .......................................................... 257/77
See application file for complete search history.

(56) References Cited

U.S. PATENT DOCUMENTS

| | | | |
|---|---|---|---|
| 8,232,558 | B2 | 7/2012 | Zhang et al. |
| 8,653,534 | B2 | 2/2014 | Zhang et al. |
| 9,318,624 | B2 | 4/2016 | Zhang |
| 9,548,353 | B2 * | 1/2017 | Aketa ............... H01L 29/66212 |
| 9,748,342 | B2 | 8/2017 | Oota et al. |
| 9,831,355 | B2 | 11/2017 | Zhang |
| 9,859,383 | B2 | 1/2018 | Konrath et al. |
| 2004/0173801 | A1 | 9/2004 | Willmeroth |
| 2008/0029838 | A1 | 2/2008 | Zhang et al. |
| 2009/0289262 | A1 | 11/2009 | Zhang et al. |
| 2012/0241762 | A1 | 9/2012 | Noda et al. |
| 2012/0273802 | A1 | 11/2012 | Zhang et al. |
| 2014/0077228 | A1 | 3/2014 | Zhang et al. |
| 2014/0145289 | A1 | 5/2014 | Zhang |
| 2014/0266403 | A1 | 9/2014 | Das et al. |
| 2015/0144966 | A1 | 5/2015 | Konrath et al. |
| 2016/0211387 | A1 | 7/2016 | Zhang |
| 2016/0276442 | A1 | 9/2016 | Oota et al. |
| 2018/0061951 | A1 | 3/2018 | Kitamura |
| 2018/0190651 | A1 | 7/2018 | Siemieniec et al. |
| 2020/0091298 | A1 | 3/2020 | Hori |

FOREIGN PATENT DOCUMENTS

| | | |
|---|---|---|
| CN | 104681637 A | 6/2015 |
| CN | 110571282 | 12/2019 |
| CN | 112038393 | 12/2020 |
| CN | 112038398 | 12/2020 |
| CN | 212725323 | 3/2021 |
| DE | 10259373 | 3/2012 |
| DE | 102013019851 A1 | 5/2015 |
| DE | 102017100109 A1 | 7/2018 |
| EP | 2289105 A1 | 3/2011 |
| EP | 2816608 A2 | 12/2014 |
| EP | 2926377 A1 | 10/2015 |
| JP | 2011521471 A | 7/2011 |
| JP | 5537545 B2 | 7/2014 |
| JP | 2014150286 A | 8/2014 |
| JP | 2016502763 A | 1/2016 |
| JP | 5926316 B2 | 5/2016 |
| JP | 2018110234 A | 7/2018 |
| JP | 6425659 B2 | 11/2018 |
| KR | 101764038 B1 | 8/2017 |
| KR | 20150089054 | 8/2017 |
| WO | 2009142721 A1 | 11/2009 |

OTHER PUBLICATIONS

European Search Report and Written Opinion for Application Serial No. EP21182970; dated Nov. 11, 2021.
Losee, P. A.; Zhu, L.; Chow, T. P.; Bhat, I. B.; Gutmann, R. J.; "Degraded Blocking Performance of 4H-SiC Rectifiers under High dV/dt Conditions"; Proceedings of the 17th International Symposium on Power Semiconductor Devices & IC's in Santa Barbara, CA, USA; May 23-26, 2005.

* cited by examiner

SILICON CARBIDE POWER DIODE DEVICE AND FABRICATION METHOD THEREOF

CROSS-REFERENCE TO RELATED APPLICATIONS

This application claims priority to Chinese Invention Patent Application No. 202010626798.6 entitled "SILICON CARBIDE POWER DIODE DEVICE AND PREPARATION METHOD THEREOF" filed before China's National Intellectual Property Administration on Jul. 1, 2020, Chinese Utility Model Application No. 202021269885.2 entitled "SILICON CARBIDE MPS DEVICE" filed before China's National Intellectual Property Administration on Jul. 1, 2020, and Chinese Invention Application No. 202010626793.3 entitled "METHOD FOR PREPARING SILICON CARBIDE POWER DIODE DEVICE" filed before China's National Intellectual Property Administration on Jul. 1, 2020, the entire contents of each of which are incorporated herein by reference.

STATEMENT RE: FEDERALLY SPONSORED RESEARCH/DEVELOPMENT

Not Applicable

BACKGROUND

1. Technical Field

The present invention relates to the technical field of semiconductor devices, and more particularly, to a silicon carbide power diode device and a method for manufacturing a silicon carbide power diode device.

2. Technical Background

Compared with traditional Si-based devices, SiC devices have the characteristics of faster operating frequency, less operating loss, and higher operating temperature. As a representative device of SiC power devices, SiC diodes are widely used in power supplies, new energy vehicles and other fields.

The forward voltage of SiC SBD (Schottky Barrier Diode) is low, and the operating frequency is fast. There is no reverse recovery time and loss of PiN diodes. However, due to its poor reverse blocking characteristics, the operating voltage can only be below 200V, which cannot be satisfied. Demand in the 650V/1200V high voltage field.

As an improved structure of SiC SBD, SiC JBS (Junction Barrier Schottky) adds a P-type implant in the active region on the basis of the SBD device structure. By adjusting parameters such as PN ratio, implanted doping concentration and dose, the leakage current can be greatly reduced, the reverse blocking characteristics of the JBS device can be improved, and the reliability of the device can also be improved. However, due to its poor surge capability and poor stability, JBS cannot meet customer needs in some outdoor surge-resistant lightning-resistant test environments.

SiC MPS (Merged PiN Schottky) is a new diode structure that combines the characteristics of JBS and PiN diodes. It forms an ohmic contact on the P-type implanted area of the active area. Under the condition of large current, the potential barrier of the PiN diode is turned on, which can further increase the inrush current of the device and meet the needs of higher-end fields.

In the prior art, SiC MPS usually forms multiple P-type implanted regions in the active region, and ohmic contact metal is grown on each P-type implanted region, but due to the existing equipment (lithography machine) and etching process restrictions, in order to better etch the P-type implanted area and facilitate the growth of ohmic contact metal, it is necessary to appropriately increase the area of the P-type implanted area to achieve a better process window, otherwise an excessively high aspect ratio is difficult to carry out etch and metal growth and other etch related processes; and in order to ensure that the inrush current of the device is large enough and the current is stable enough, it is necessary to set up enough P-type injection regions, which directly leads to the reduction of the N-type conductive region and the forward voltage drop Increased, the device conduction loss increases. Therefore, in the case of ensuring the size of the N-type conductive region, there is a contradiction between the number requirements of the P-type injection region and the design direction of miniaturization.

BRIEF SUMMARY

The purpose of the present invention is to overcome the shortcomings of the current technology, to provide a silicon carbide power diode device and its preparation method, while ensuring that the MPS device has good forward surge capability and forward conduction characteristics, while avoiding the process of ohmic contact Process problems caused by narrow windows. The technical solution of the present invention is as follows:

A silicon carbide power diode device includes at least:

SiC substrate; SiC epitaxial layer, Disposed on the first surface of the SiC substrate, the SiC epitaxial layer is provided with an active region;

The Schottky metal layer is provided on the surface of the active area of the SiC epitaxial layer;

The first electrode layer is provided on the surface of the Schottky metal layer;

The first ohmic contact metal layer is provided on the second surface of the SiC substrate;

The second electrode layer is provided on the surface of the first ohmic contact metal layer;

The active region includes at least one or a plurality of first P-type regions, a plurality of second P-type regions, and an N-type region. The first P-type region and the second P-type region are spaced apart; the surface of the first P-type region is provided with a A second ohmic contact metal layer, the second ohmic contact metal layer is located between the first P-type region and the Schottky metal layer, and the second P-type region is not provided with an ohmic contact metal layer.

Among them, the active area of the silicon carbide epitaxial layer is given the size of the first P-type region (including but not limited to the surface area) and then the size of the second P-type region (including but not limited to the surface area) is minimized and (Maximum size of N-type area including but not limited to surface area).

Wherein, the size (including but not limited to the surface area) of the first P-type region given is wider than the size (including but not limited to the surface area) of the second P-type region (including but not limited to the width) settings.

Among them, the second ohmic contact metal layer completely covers the first P-type region.

The second ohmic contact metal layer is a bulk metal layer that does not completely cover the first P-type region.

The first P-type region and the second P-type region are both strip-shaped, and the width of the surface of any first P-type region is greater than the width of any second P-type region.

Wherein, each first P-type region has the same width and is arranged at equal intervals.

Among them, the widths of the first P-type regions are not all the same.

Wherein, the distance between the adjacent sides of the adjacent first P-type regions is the same, that is, the distance between the opposite sides of the first P-type region is the same between the adjacent first P-type regions.

Among them, the first P-type region and the second P-type region are block regions.

Wherein, the plane area of the surface of any one first P-type region is larger than the plane area of the surface of any one second P-type region.

The first P-type region and the second P-type region are rectangular regions, trapezoidal regions, regular polygonal regions (such as regular hexagons), circular regions, irregular regions, or a combination thereof.

Wherein, the first P-type region and the second P-type region are a combination of stripe and block regions (for example, square regions).

Wherein, at least one first P-type region is strip-shaped, and at least one second P-type region is a block region, and the plane area of the surface of the first P-type region is larger than the plane area of the surface of the second P-type region.

Wherein, at least one first P-type region is a block region, and at least one second P-type region is a bar shape, and the radial width of the surface of the first P-type region in any direction is greater than the surface width of the second P-type region.

The total planar area of the surface of the N-type region is 1 to 10 times the total planar area of the surface of the first P-type region and the surface of the second P-type region.

Among them, the value of the surface width of any first P-type region is 1-10 µm, and the number is ≥2.

Among them, the surface width of any second P-type region is ≥0.1 µm.

The first ohmic contact metal layer and the second ohmic contact metal layer are any one or a combination of Ti, Ni, Al, Au, Ta, or W.

Wherein, the Schottky metal layer is any one or a combination of Ti, W, Ta, Ni, Mo or Pt.

A method for manufacturing a silicon carbide power diode device includes the following steps:

1) growing an SiC epitaxial layer with an N-type active region on the first surface of the SiC substrate;

2) Deposit a protective film on the surface of the SiC epitaxial layer, open multiple spaced implantation windows in the N-type active area by etching, and perform ion implantation in the implantation window of the N-type active area; activated by high temperature, N-type The active region forms at least one first P-type region and a plurality of second P-type regions arranged at intervals;

3) The surface of the first P-type region is completely covered or partially covered with a metal layer, and the surface of the second P-type region is not covered with a metal layer; through high-temperature annealing, a second ohmic contact metal layer is formed on the surface of the first P-type region 4) The SiC epitaxial surface is covered with a metal layer, which is annealed at high temperature to form a Schottky metal layer, and the first electrode layer is deposited on the Schottky metal layer.

Among them, in step 2), the implantation area in the terminal area is also opened by etching, and ion implantation is performed in the implantation area of the terminal area; by activation (such as high temperature activation), the terminal area forms a terminal structure.

Among them, it also includes step 5) growing a first passivation layer on the surface of the terminal structure, forming a second passivation layer on the surface of the first passivation layer; etching to obtain the contact area of the first electrode layer; on the surface of the first ohmic contact metal layer A second electrode layer is deposited.

Wherein, step 3) or step 5) further includes the steps of: covering a second layer of the SiC substrate with a metal layer, and forming a first ohmic contact metal layer on the second surface of the SiC substrate by high-temperature annealing, A second electrode layer is deposited on the surface of the first ohmic contact metal layer.

Among them, the high-temperature annealing process for forming the first ohmic contact metal layer and the second ohmic contact metal layer is 800° C. 1100° C. 1100° C., the time is 60 s-300 s; the high-temperature annealing process to form the Schottky metal layer, the temperature is 300° C.-500° C. time is 60 s-300 s.

Among them, the thickness of the first electrode layer is 25 µm; the thickness of the first passivation layer is 0.5 3 µm; and the thickness of the second electrode layer is 2-5 µm.

Wherein, the first ohmic contact metal layer and the second ohmic contact metal layer are any one or a combination of Ti, Ni, Al, Au, Ta or W.

Wherein, the Schottky metal layer is any one or a combination of Ti, W Ta, Ni, Mo or Pt.

Among them, the first P-type region and the second P-type region are both strip-shaped, and the surface area of any one first P-type region is larger than the surface area of any one second P-type region.

Among them, the first P-type region and the second P-type region are block regions, and the surface area of any one first P-type region is larger than the surface area of any one second P-type region.

Among them, the first P-type region and the second P-type region are a combination of strip and block regions; when the first P-type region is a strip and the second P-type region is a block region, the surface of the first P-type region The surface area of the first P-type region is larger than the surface area of the second P-type region; when the first P-type region is a block region and the second P-type region is a strip, the radial width of the first P-type region surface in any direction Second P-type surface width.

The beneficial effects of the present invention are as follows:

The silicon carbide power diode device of the present invention is provided with P-type regions of roughly two specifications. The surface of the first P-type region with larger surface area and wider coverage is covered with ohmic contact metal, and the surface area with smaller surface area and narrower There is no ohmic contact metal on the surface of the second P-type region. Under the condition of small current, the current passes through the N-type region of the active region; under the condition of high current, the forward voltage of the diode rises, and the PiN diode barrier formed by the surface of the first P-type region covered by the ohmic contact is turned on. Current can pass through this area, thereby improving the surge current capability of the diode.

The preparation method of the silicon carbide power diode device of the present invention is used to prepare the silicon carbide power diode device of the present invention.

Under low current conditions, the N-type region of the diode is the region that conducts current. In theory, under the premise that the surface area of the P-type region is the same, the larger the surface area of the N-type region, the stronger the forward current capability of the diode. Under high current conditions, theoretically, under the premise that the surface area of the N-type region is the same, the larger the area of the surface of the P-type region covered with the ohmic contact metal, the greater the surge capability of the diode. Therefore, how to choose between the forward current capability and the surge capability of the diode is the focus and difficulty of the device structure design. Due to semiconductor device and process capability issues, making ohmic metal contacts on each P-type implanted region requires too much precision in the etching process. In order to be compatible with the stability of the process and the type that can be mass-produced, the width of the surface of the P-type region covered with ohmic metal is greater than 0.3 um, so a part of the surface area of the N-type region is wasted. The silicon carbide power diode device of the present invention uses two different specifications of P-type regions, the surface of the first P-type region with larger surface area and wider coverage is covered with ohmic metal, and the second P-type region with smaller surface area and narrower There is no ohmic contact metal on the surface of the zone. The combination of the two can increase the current density of the diode and reduce the on-voltage drop while maintaining the same surge capacity of the diode.

In the figure: 10 is the SiC substrate, 20 is the SiC epitaxial layer, 21 is the active region, 22 is the first P-type region, 23 is the second P-type region, 24 is the N-type region, 25 is the terminal region, 26 is Terminal structure, 30 is Schottky metal layer, 40 is the first electrode layer, 50 is the first ohmic contact metal layer, 60 is the second electrode layer, 70 is the second ohmic contact metal layer, 81 is the first passivation layer, 82 is the second passivation layer.

DETAILED DESCRIPTION

The present invention will be further described in detail below with reference to the drawings and embodiments.

The present invention provides a silicon carbide in order to solve the shortcomings of the existing MPS device of the prior art, such as the forward surge capability and the forward conduction characteristic, and the ohmic process window cannot be narrow enough (because the effect of ohmic metal deposition needs to be considered). Power diode devices and their preparation methods, especially MPS devices, to improve process compatibility, simplify process complexity, and achieve the characteristics of low forward voltage drop, high reverse voltage, and high surge current.

Example One

Figure 1:
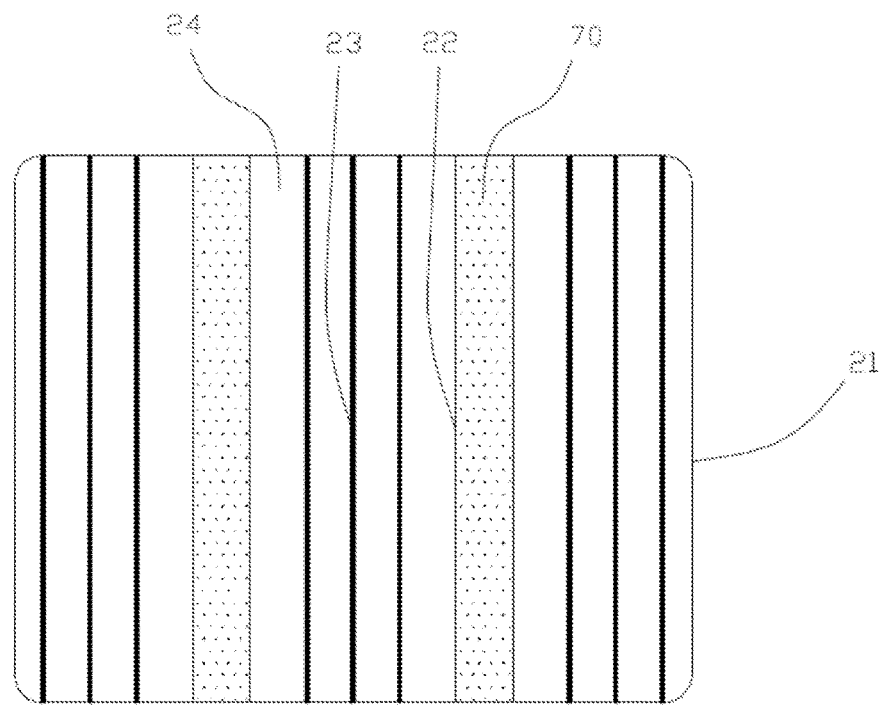
FIG. 1 is a schematic structural diagram of an active region in Embodiment 1 (the second ohmic contact metal layer completely covers the first P-type region)
Figure 2:
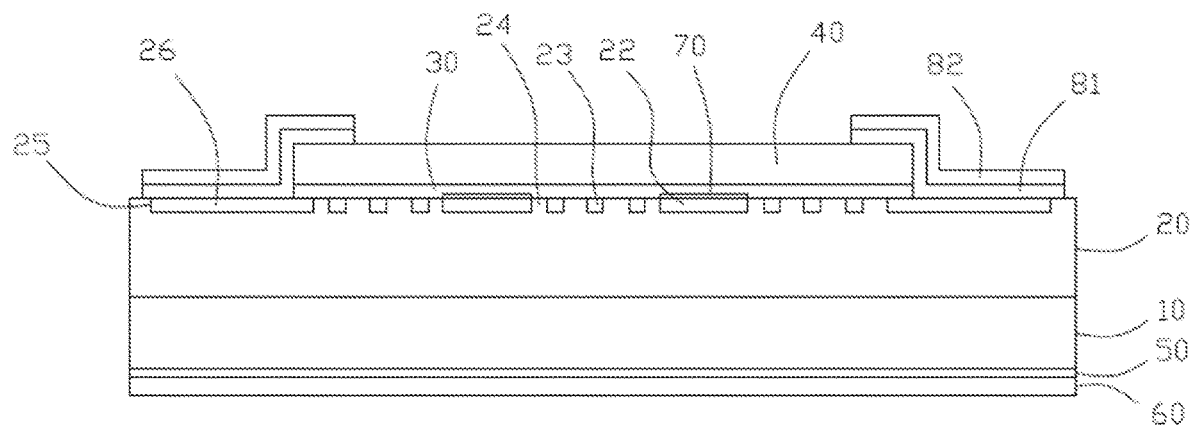
FIG. 2 is a schematic cross-sectional view of Embodiment 1 (the second ohmic contact metal layer completely covers the first P-type region)

As shown in FIGS. 1 and 2, the silicon carbide power diode device of the present invention, that is, an MPS device, at least includes:

SiC substrate 10;

The SiC epitaxial layer 20 is provided on the first surface of the SiC substrate 10, and the SiC epitaxial layer 20 is provided with an active region 21;

The Schottky metal layer 30 is provided on the surface of the active region 21 of the SiC epitaxial layer 20;

The first electrode layer 40 is disposed on the surface of the Schottky metal layer 30;

The first ohmic contact metal layer 50 is provided on the second surface of the SiC substrate 10;

The second electrode layer 60 is disposed on the surface of the first ohmic contact metal layer 50;

The active region 21 includes a plurality of first P-type regions 22, a plurality of second P-type regions 23, and an N-type region 24; the surface of the first P-type region 22 is provided with a second ohmic contact metal layer 70, that is, the first P-type region 22 The second ohmic contact metal layer 70 is an ohmic contact. The second ohmic contact metal layer 70 is located between the first P-type region 22 and the Schottky metal layer 30. The second P-type region 23 is not provided with an ohmic contact metal layer. That is, it is directly covered by the Schottky metal layer 30. Based on the structure that the second P-type region 22 is provided with the second ohmic contact metal layer 70 and the second P-type region 23 is not provided with the ohmic contact metal layer. Among them, the active region of the SiC epitaxial layer 20 is given the size of the first P-type region 22 (including but not limited to the surface area), and then the size of the second P-type region 23 (including but not limited to the surface) is minimized Area, and maximize the size of the N-type region 24 (including but not limited to the surface area). Moreover, the size (including but not limited to the surface area) of the domain of the first P-type region 22 in a given setting is wider than the size (including but not limited to the surface area) of the domain of the second P-type region 23 (including but not limited to the surface area width).

In the present invention, the width of the second P-type region 23 may be implemented as narrow as possible, under the condition that the size of the active region 21 is fixed, the total planar area of the surface of the first P-type region 22 and the second P-type region 23 can be reduced, so that the planar area of the surface of the N-type region 24 increases. And therefore reduce forward voltage drop and improve forward conduction characteristic without increase total device area. In the present invention, the size of the effective range for passing current within the range of the first P-type region 22 is actually determined by the size of the overlapping area between the first P-type region 22 and the second ohmic contact region 70. Based on the fact that the first P-type region 22 is sufficiently large, the shape of the second ohmic contact metal layer 70 can be diversified and good forward surge capability can be satisfied, while the second P-type region 23 can be as narrow as possible. In the present invention, the size relation between the first P-type region 22 and the second P-type region 23 can be selected according to the following principle, that is, when the surface of any first P-type region 22 completely covers or partially covers the ohmic contact, Assuming that the surface of any one second P-type region 23 completely covers the ohmic contact, the amount of current passing through the first P-type region 22 must be greater than the second P-type region 23.

During specific implementation, the second ohmic contact metal layer 70 may be implemented to cover the first P-type region 22 beyond the range, or substantially coincide with the first P-type region 22, or slightly smaller than the first P-type region 22, or only cover the first Part of the P-type region 22.

In this embodiment, the first P-type region 22 and the second P-type region 23 are both strip-shaped, and the surface area of any first P-type region 22 is larger than the surface area of any second P-type regions 23. When the first P-type region 22 and the second P-type region 23 are both strip-shaped, the length difference between the first P-type region 22 and the second P-type region 23 is small, the first P can be determined by expressing the width value The relationship between the difference in the planar areas of the surfaces of the type region 22 and the second P type region 23. In the present invention, the first P-type region 22 and the second P-type region 23 are placed alternatively to avoid the mutual influence of the heat generated by the adjacent second ohmic contact metal layer 70 due to operation, thereby affecting the overall heat dissipation of the device, causing instability of the devices.

In this embodiment, the widths of the first P-type regions 22 are the same and are arranged at equal spacing; or, the widths of the first P-type regions 22 are not all the same, and the distance between opposite sides of the adjacent first P-type regions 22 is the same; furthermore, The heat generated by the second ohmic contact metal layer 70 due to operation is evenly distributed, which can improve heat dissipation, and can effectively controls the overall temperature rise to ensure the stability of the device. In specific implementation, the geometric center distance between adjacent first P-type regions 22 is 10 μm-300 μm.

In specific implementation, the first P-type region 22 and the second P-type region 23 may be implemented as rectangular strips, trapezoidal strips, regular hexagons, irregular strips (such as wedge-shaped or other irregular strips with long sides) or combination. In this embodiment, the second ohmic contact metal layer 70 completely covers the first P-type region 22, and is implemented as a rectangular strip.

Figure 3:
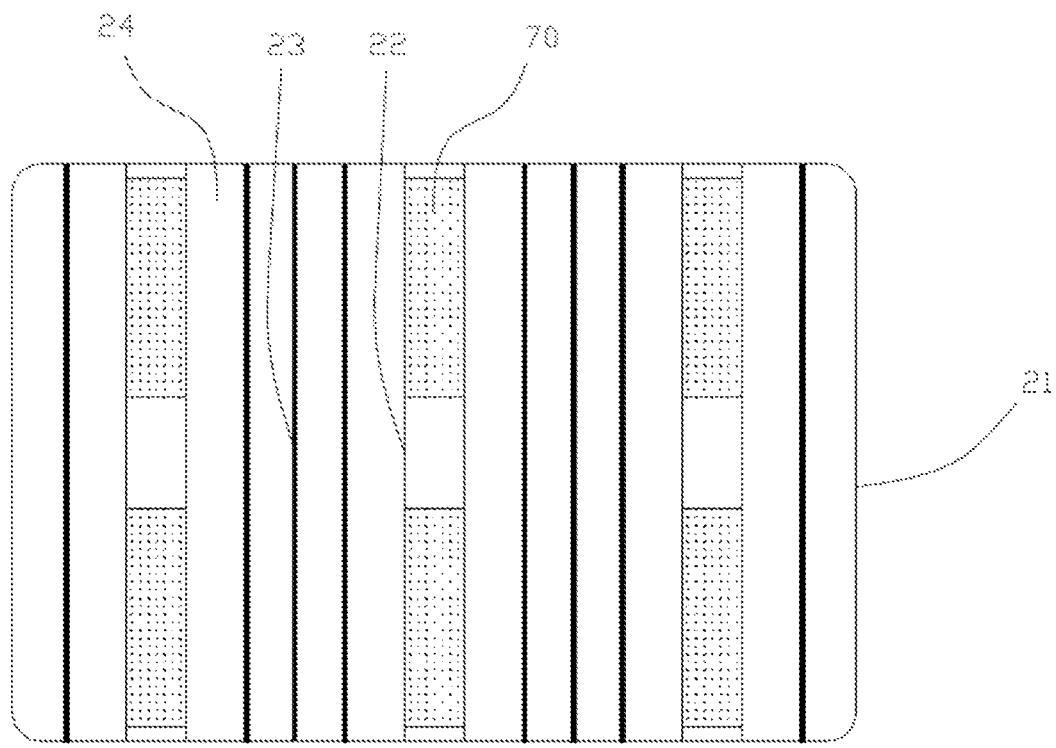
FIG. 3 is a schematic structural diagram of an active region according to Embodiment 1 (the second ohmic contact metal layer is a bulk metal layer)

As another embodiment, as shown in FIG. 3, the second ohmic contact metal layer 70 is a block shaped metal layer which does not completely cover the first P-type region 22. Every first p region is at least covered by one second ohmic contact metal layer 70. When the second ohmic contact metal layer 70 is a block shaped metal layer, the center distance of the adjacent second ohmic contact metal layer 70 is 10 μm-300 μm; and the second ohmic contact metal layer 70 is uniformly arranged, which is in favor of uniform heat dissipation and can effectively control the overall temperature rise to ensure the stability of the device.

In order to balance the good forward surge capability and forward conduction characteristics by the present invention, the total planar area of the surface of the N-type region 24 is 1 to 10 times of the total planar area of the first P-type region 22 and the second P-type region 23. Preferably, the total planar area of the N-type region 24 is 3 times the total planar area of the first P-type region 22 and the second P-type region 23. In addition, the surface width value of any one first P-type region 22 is 1-10 μm, the number≥2, and the surface width value of any one second P-type region 23 is ≥0.1 μm.

As an effective area defining the active region 21, the SiC epitaxial layer 20 is further provided with a terminal region 25, which surrounds the active region 21, and a first passivation layer 81 is provided on the surface of the terminal region 25, the first passivation The layer 81 covers the surface edge of the first electrode layer 40. Further, the surface of the first passivation layer 81 covers the second passivation layer 82. In this embodiment, the first passivation layer 81 is a dielectric layer made of silicon oxide or silicon nitride; the second passivation layer 82 is a PI layer made of polyimide.

In order to ensure good ohmic characteristics between the first ohmic contact metal layer 50 and the SiC substrate 10 and the second ohmic contact metal layer 70 and the first P-type region 22, the first ohmic contact metal layer 50 and the second ohmic contact metal layer 70 is any one or a combination of Ti, Ni, Al, Au, Ta, or W. In this embodiment, the first ohmic contact metal layer 50 and the second ohmic contact metal layer 70 are Ti/Ni combined multilayers.

In order to ensure good Schottky characteristics between the Schottky metal and the N-type region 24, the Schottky metal layer 30 is any one or a combination of Ti, W, Ta, Ni, Mo or Pt. In this embodiment, the Schottky metal layer 30 is a multilayer metal of Ti/Ni/Ag combination.

Figure 4:
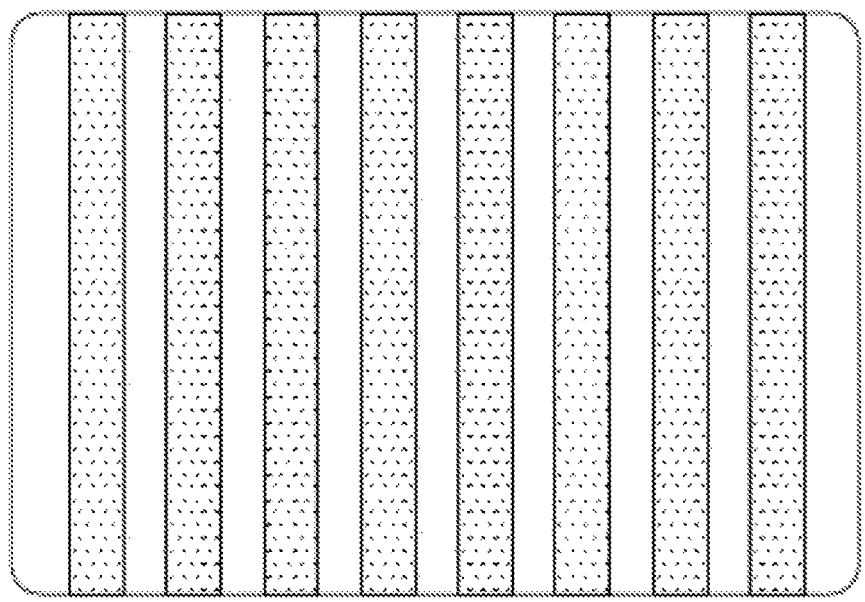
FIG. 4 is a schematic diagram of a structure of an active area of a reference example.
Figure 5:
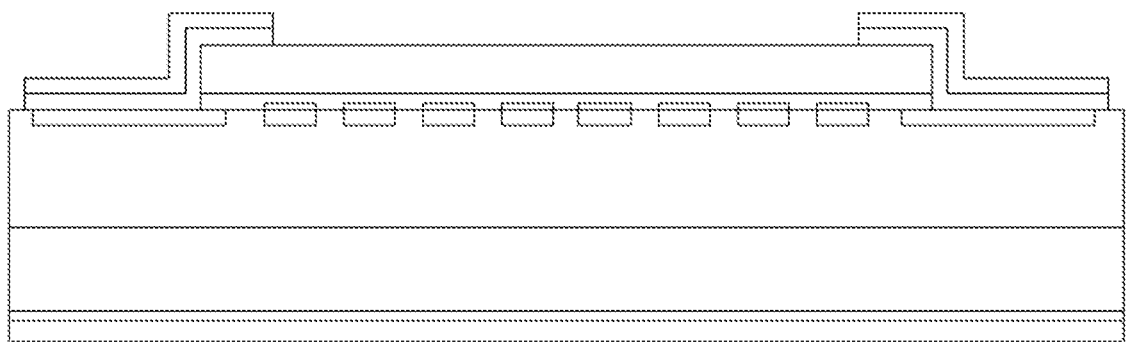
FIG. 5 is a schematic cross-sectional view of a reference example.

Compared with the reference example based on the prior art (as shown in FIGS. 4 and 5), it is assumed that the present invention has the same area as the active area 21 of the reference example and is provided with the same number of P-type regions. The regions all cover the ohmic contact metal layer. In the present invention, only the first P-type region 22 covered with the second ohmic contact metal layer 70, and the second P-type region 23 covered with the second ohmic contact metal layer 70.

In the present invention, to guarantee the same forward surge capacity as the reference example, the plane area of the first P-type region 22 and the second P-type region 23 is smaller than the total plane area of the P-type region of the reference example, then the planar area of the N-type region 24 in this invention is larger than the planar area of the N-type region 24 of the reference example, and the present invention has better forward conduction characteristics than the reference example.

Through experiments, in the case of passing a large forward current, the P-type region and the N-type region 24 of the reference example can pass a large current. The total planar area of the second ohmic contact metal layer 70 and the N-type region 24 from present invention can passing a large current, the present invention has the same forward surge capability as the reference example.

In the case of passing a small forward current, the reference example and the N-type region 24 of the present invention can both pass a small current. Since the plane area of the N-type region 24 of the present invention is larger than that of the reference example, the current density is higher, therefore the present invention has better forward conduction characteristics than the reference Examples.

Figure 6:
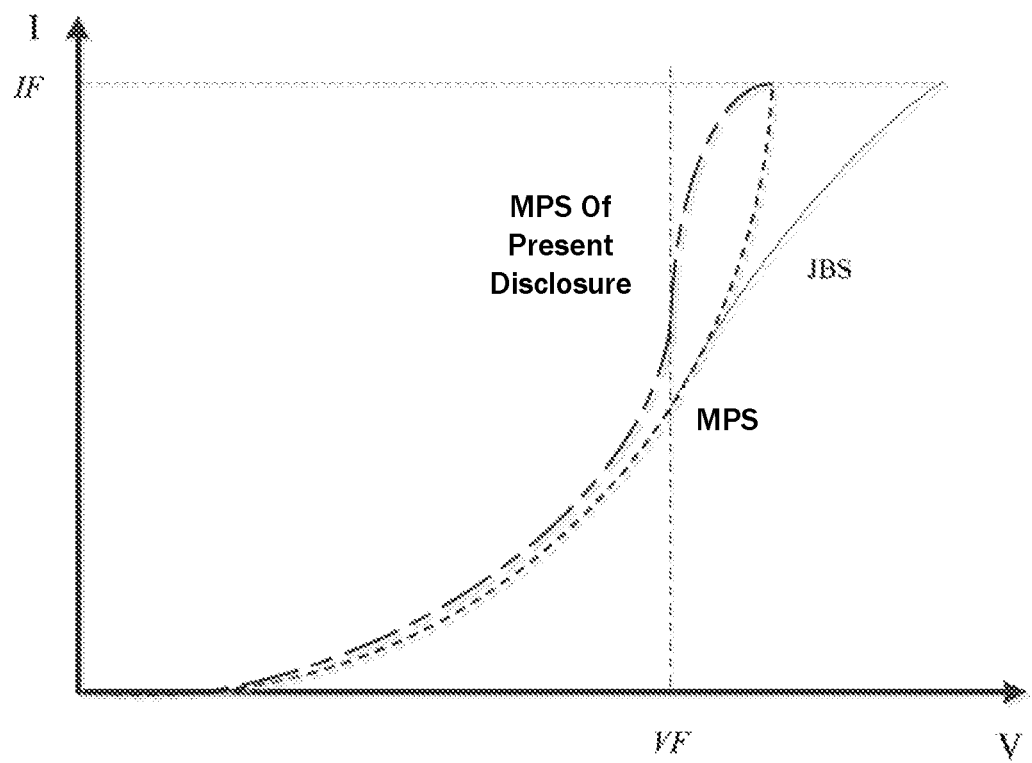
FIG. 6 is a schematic diagram comparing I-V characteristic curves of the present invention and a reference example.

As shown in FIG. 6, the present invention under the condition of small current, the current passes through the N-type region of the active region; under the condition of large current, the forward voltage of the diode increases, and PiN diode barrier formed by the first P-type region covered with ohmic contacts is opened, and current can pass through this area, thereby improving the surge current capability of the diode.

Example 2

Figure 7:
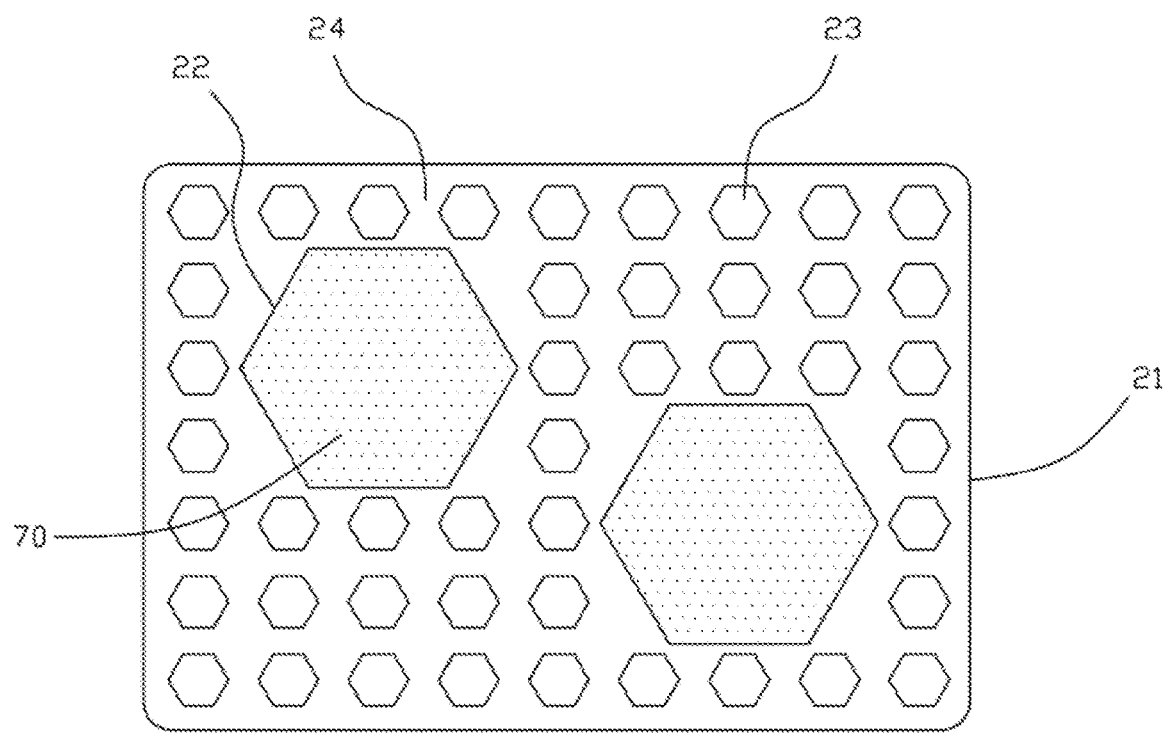
FIG. 7 is a schematic structural diagram of an active region in Embodiment 2.

The difference between this embodiment and the first embodiment is that the shapes of the surfaces of the first P-type region 22 and the second P-type region 23 are different. As shown in FIG. 7, in this embodiment, the first P-type region 22 and the second P-type region 23 Area 23 is a block area. In the same way as the embodiment, in this embodiment, the plane area of the surface of any first P-type region 22 is larger than the plane area of the surface of any one of the second P-type regions 23.

During specific implementation, the first P-type region 22 and the second P-type region 23 are rectangular regions, regular polygonal regions, circular regions, irregular regions, or a combination thereof, and the second ohmic contact metal layer 70 usually completely covers the first P-type region 22, and the shape of the second ohmic contact metal layer 70 is in phase with the first P-type region 22.

The other parts are the same as the first embodiment.

Example 3

Figure 8:
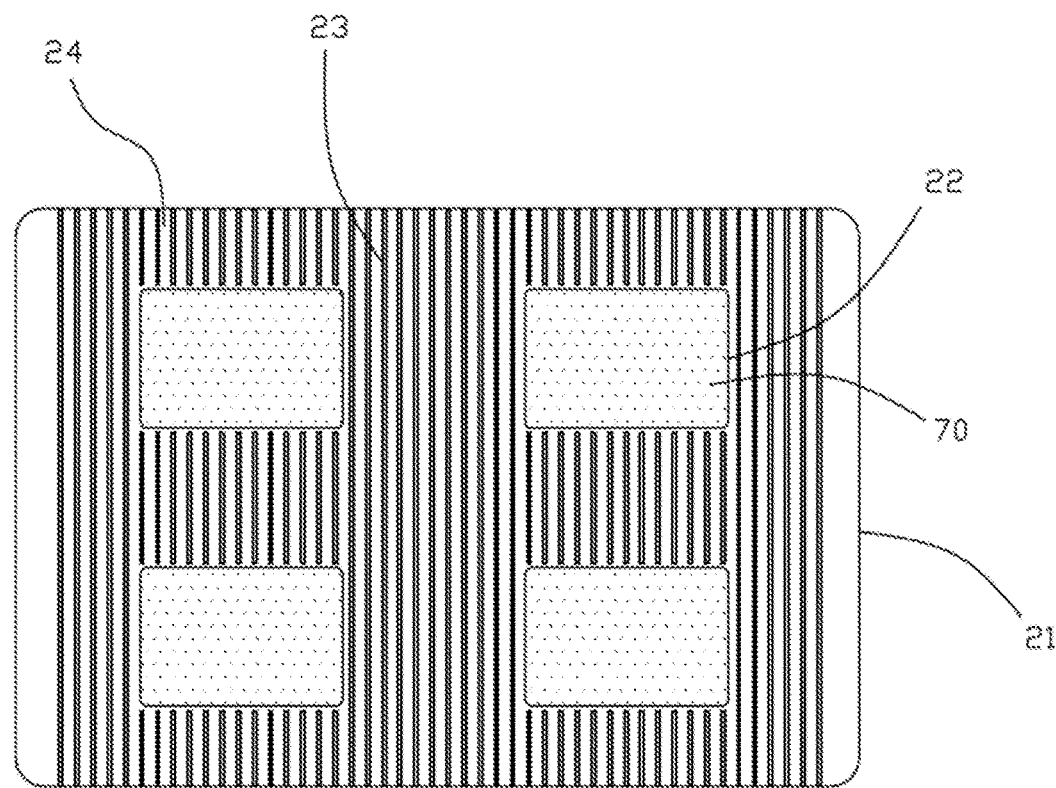
FIG. 8 is a schematic structural diagram of an active region in Embodiment 3.

The difference between this embodiment and Embodiment 1 is that the shapes of the surfaces of the first P-type region 22 and the second P-type region 23 are different. As shown in FIG. 8, in this embodiment, the first P-type region 22 and the second P-type region 23 The area 23 is a combination of stripe and block areas. The same as the embodiment, in this embodiment, when the first P-type region 22 is strip-shaped and the second P-type region 23 is a bulk region, the surface area of the surface of the first P-type region 22 is larger than that of the second P-type region 23 The planar area of the surface; when the first P-type region 22 is a block region and the second P-type region 23 is a strip, the radial width of the surface of the first P-type region 22 in any direction is larger than that of the second P-type region 23 Surface width.

During specific implementation, the first P-type region 22 and the second P-type region 23 are rectangular strips, trapezoidal strips, irregular strips, rectangular regions, regular polygonal regions, circular regions, irregular regions, or a combination thereof, in this embodiment In which, the first P-type region 22 is a rectangular region, and the second P-type region 23 is a rectangular strip; and the second ohmic contact metal layer 70 usually completely covers the first P-type region 22, and then the second ohmic contact metal layer 70 The shape is the same as the first P-type region 22.

The other parts are the same as the first embodiment.

Example 4

The invention also provides a method for preparing a silicon carbide power diode device, which is used for preparing the silicon carbide power diode device, and the steps are as follows:

1) On the first surface of the SiC substrate 10, a SiC epitaxial layer 20 having an N-type active region 21 is grown; specifically, an RCA cleaning process is performed on the SiC substrate 10, and the SiC substrate 10 has a crystal form of 4H-SiC and a thickness 350 μm, doping concentration is 1E19-1E20/cm3; using MOCVD, N-type SiC epitaxial layer 20 is grown on the first surface of N-type SiC substrate 10, the thickness of SiC epitaxial layer 20 is 5-80 μm, the doping concentration is 1E14-5E16/cm3.

2) A protective film is deposited on the surface of the SiC epitaxial layer 20, and the deposition method can be PVD or CVD. Dry etching is used to open a plurality of spaced-apart injection windows in the injection region of the terminal region 25 and the N-type active region 21, Ion implantation is performed in the implantation regions of the terminal region 25 and the active region 21; after activation at high temperature, the terminal region 25 forms a terminal structure 26, and the N-type active region 21 forms a plurality of spaced first P-type regions 22 and a plurality of second P-type area 23;

3) The second surface of the SiC substrate 10 is covered with a metal layer, and the surface of the first P-type region 22 is completely covered or partially covered with a metal layer, and the surface of the second P-type region is not covered with a metal layer; A first ohmic contact metal layer 50 is formed on the second surface of the SiC substrate 10, and a second ohmic contact metal layer 70 is formed on the surface of the first P-type region 22;

Wherein, a metal layer is formed on the second surface of the SiC substrate 10 by deposition or sputtering, and a metal layer is formed on the first P-type region 22 by deposition or sputtering; forming the first ohmic contact metal layer 50, the first The high-temperature annealing process of the two-ohm contact metal layer 70, the temperature is 800° C.-1100° C., the time is 60 s-300 s;

4) A metal layer is covered on the surface of the SiC epitaxial layer 20, and the Schottky metal layer 30 is formed by high-temperature annealing, and the first electrode layer 40 is deposited on the Schottky metal layer 30;

A high-temperature annealing process for forming a metal layer on the surface of the SiC epitaxial layer 20 by deposition or sputtering to form the Schottky metal layer 30 at a temperature of 300° C.-500° C. and a time of 60 s-300 s. Continue to deposit the first electrode layer 40 of 2-5 μm on the Schottky metal layer 30 as the anode electrode; remove the Schottky metal layer 30 and the first electrode layer 40 covering the terminal structure 26 by the etching method (ie the preparation process In, the Schottky metal layer 30 and the first electrode layer 40 inevitably remain on the surface of the terminal structure 26 metal);

5) Growth of 0.5-3 μm dielectric layer on the surface of the terminal structure 26 by CVD or PVD, as the first passivation layer 81, coating 2-5 μm Polyimide on the surface of the first passivation layer 81, as the second purification layer; by wet method or A dry etching method is used to etch the contact area of the first electrode layer 40; a 2-5 μm second electrode layer 60 is deposited on the surface of the first ohmic contact metal layer 50 as a cathode electrode.

In this embodiment, the preparation of the first ohmic contact metal layer 50 in step 3) can also be performed in step 5): the second electrode layer 60 in step 5) can be prepared in step 3) After the layer 50 is prepared continuously, it may also be performed at intervals with the preparation of the first ohmic contact metal layer 50 in step 3).

In step 1), the doping concentration of the SiC substrate 10 is preferably 2E19/cm3; the thickness of the SiC epitaxial layer 20 is preferably 10 μm, and the doping concentration is preferably 1E16/cm3.

In step 3), the first ohmic contact metal layer 50 and the second ohmic contact metal layer 70 are preferably Ti/Ni combined multilayer metal; the process temperature is preferably 950° C., and the time is preferably 100 s;

In step 4), the Schottky metal layer 30 is preferably Ti; the process temperature is preferably 450° C., and the time is preferably 100 s; the first electrode layer 40 is preferably Al, and the thickness is preferably 4 μm.

In step 5), the first passivation layer 81 is preferably silicon oxide SiO2, the thickness is preferably 1.2 μm, the thickness of the second passivation layer 82 is preferably 5 μm; the second electrode layer 60 is preferably a combination of Ti/Ni/Ag For layer metal, the thickness is preferably 2 μm.

Based on the manufacturing method described in this embodiment, the silicon carbide power diode devices described in Embodiment 1, Embodiment 2, and Embodiment 3 can be prepared according to the structures described in Embodiment 1, Embodiment 2, and Embodiment 3.

The above embodiments are only used to illustrate the present invention, and are not intended to limit the present invention. As long as it is based on the technical essence of the present invention, changes, modifications, etc. to the above embodiments will fall within the scope of the claims of the present invention.

What is claimed is:

1. A silicon carbide power diode device, at least including:
    a silicon carbide substrate defined by a first surface on which a silicon carbide epitaxial layer is provided and a second surface, the silicon carbide epitaxial layer including an active region;
    a Schottky metal layer on a surface of the active region of the silicon carbide epitaxial layer;
    a first electrode layer on a surface of the Schottky metal layer;
    a first ohmic contact metal layer on the second surface of the silicon carbide substrate;
    a second electrode layer on the surface of the first ohmic contact metal layer; and
    second ohmic contact metal layers;
    wherein the active region of the silicon carbide epitaxial layer includes a plurality of first P-type regions, a plurality of second P-type regions, and N-type regions, the first P-type regions and the second P-type regions being spaced apart by given ones of the N-type regions with dimensions of the second P-type regions being minimized and the N-type regions being maximized for given dimensions of the first P-type region, the second ohmic contact layers being located between the first P-type region and the Schottky metal layer, and the second P-type region lacking an ohmic contact metal layer.

2. The silicon carbide power diode device of claim 1, wherein the second ohmic contact metal layer completely covers the first P-type region.

3. The silicon carbide power diode device of claim 1, wherein the second ohmic contact metal layer partially covers the first P-type region.

4. The silicon carbide power diode device of claim 1, wherein the first P-type regions and the second P-type regions are strips, and a given width of any of the first P-type regions is greater than a given width of any of the second P-type regions.

5. The silicon carbide power diode device of claim 4, wherein widths of each of the first P-type regions are the same and are arranged at equal intervals.

6. The silicon carbide power diode device of claim 4, wherein widths of the first P-type regions are unequal.

7. The silicon carbide power diode device of claim 6, wherein distances between opposite sides of the first P-type regions are the same between adjacent ones of the first P-type regions.

8. The silicon carbide power diode device of claim 1, wherein the first P-type regions and the second P-type regions are block-shape regions.

9. The silicon carbide power diode device of claim 8, wherein a surface area of any one of the first P-type regions is larger than a surface area of any one of the second P-type regions.

10. The silicon carbide power diode device of claim 9, wherein the first P-type regions and the second P-type regions are one of a rectangular, trapezoidal, regular polygonal, circular, irregular, or a combination thereof.

11. The silicon carbide power diode device of claim 1, wherein the first P-type regions and the second P-type regions are a combination of strip-shaped and square-shaped regions.

12. The silicon carbide power diode device of claim 11, wherein:
    at least one of the first P-type regions is strip-shaped and at least one of the second P-type regions is square-shaped; and
    a surface area of a given one the first P-type regions is larger than a surface area of a given one of the second P-type regions.

13. The silicon carbide power diode device of claim 11, wherein:
    at least one of the first P-type regions is square-shaped and at least one of the second P-type regions is strip-shaped; and
    a radial width in any direction of a given one of the first P-type regions is greater than a surface width of a given one of the second P-type regions.

14. The silicon carbide power diode device of claim 1, wherein a total surface area of the N-type regions is between 1 to 10 times a total surface area of the first P-type regions and the second P-type regions combined.

15. The silicon carbide power diode device of claim 14, wherein a surface width of any first P-type region is 1 to 10 μm, and there are at least two first P-type regions.

16. The silicon carbide power diode device of claim 14, wherein a surface width of a given one of the second P-type regions is ≥0.1 μm.

17. The silicon carbide power diode device of claim 1, wherein the first ohmic contact metal layer and the second ohmic contact metal layer are any one or a combination of Titanium, Nickel, Aluminum, Gold, Tantalum, or Tungsten.

18. The silicon carbide power diode device of claim 1, wherein the Schottky metal layer is any one or a combination of Titanium, Tungsten, Tantalum, Nickel, Molybdenum, or Platinum.

\* \* \* \* \*